US012750965B2

(12) United States Patent
Cheung et al.

(10) Patent No.: US 12,750,965 B2
(45) **Date of Patent: *Sep. 29, 2026**

(54) CLAD PARTS

(71) Applicant: Apple Inc., Cupertino, CA (US)

(72) Inventors: Matthew J. Cheung, Castro Valley, CA (US); Burak Metin, San Jose, CA (US); Martin J. Auclair, Campbell, CA (US); Hongsheng Lin, Singapore (SG); Huai Z. Yang, Santa Clara, CA (US); Jurgen Shestani, Santa Clara, CA (US); Logan M. Ames, San Francisco, CA (US); Alistair F. Moras, Sunnyvale, CA (US)

(73) Assignee: APPLE INC., Cupertino, CA (US)

( * ) Notice: Subject to any disclaimer, the term of this patent is extended or adjusted under 35 U.S.C. 154(b) by 14 days.

This patent is subject to a terminal disclaimer.

(21) Appl. No.: 18/670,660

(22) Filed: May 21, 2024

(65) Prior Publication Data

US 2024/0314956 A1 Sep. 19, 2024

Related U.S. Application Data

(63) Continuation of application No. 17/930,031, filed on Sep. 6, 2022.

(Continued)

(51) Int. Cl.

*H05K 5/04* (2006.01)
*H05K 5/00* (2025.01)

(Continued)

(52) U.S. Cl.

CPC ............... *H05K 5/04* (2013.01); *H05K 5/069* (2013.01); *H05K 5/13* (2025.01); *Y10T 428/24273* (2015.01); *Y10T 428/24298* (2015.01)

(58) Field of Classification Search

CPC . H05K 5/04; H05K 5/069; H05K 5/13; Y10T 428/24273; Y10T 428/24298

See application file for complete search history.

(56) References Cited

U.S. PATENT DOCUMENTS

| | | | | |
|---|---|---|---|---|
| 6,051,327 A * | 4/2000 | Serafin | .................... | B32B 15/08 428/458 |
| 6,149,049 A | 11/2000 | Loftfield et al. | | |

(Continued)

FOREIGN PATENT DOCUMENTS

| | | | |
|---|---|---|---|
| CN | 103249267 A | 8/2013 | |
| CN | 110662377 A * | 1/2020 | ............... H05K 5/04 |
| DE | 102004054931 A1 * | 5/2006 | ........... B21K 25/005 |

OTHER PUBLICATIONS

McDonald, Andrew; "Corrosion, Part 1: What Galvanic Means"; Jul. 6, 2022 (accessed May 22, 2025); <https://boattest.com/article/corrosion-part-1-what-galvanic-means>. (Year: 2022).*

(Continued)

*Primary Examiner* — Donald M Flores, Jr.

(74) *Attorney, Agent, or Firm* — Dorsey & Whitney LLP

(57) ABSTRACT

To eliminate galvanic corrosion, a housing includes a clad material. The clad material includes an interior metal disposed within an exterior metal. The exterior metal is different from the interior metal. The housing further includes a clad interface and a melt interface. The melt interface includes a layer of hardened flux disposed on a portion of the interior metal.

20 Claims, 11 Drawing Sheets

Related U.S. Application Data

(60) Provisional application No. 63/261,588, filed on Sep. 24, 2021.

(51) Int. Cl.

| | |
|---|---|
| ***H05K 5/06*** | (2006.01) |
| ***H05K 5/13*** | (2025.01) |

(56) References Cited

U.S. PATENT DOCUMENTS

| | | | | |
|---|---|---|---|---|
| 10,447,834 | B2 | 10/2019 | Misra et al. | |
| 10,927,473 | B2 | 2/2021 | Curran et al. | |
| 12,150,264 | B1 * | 11/2024 | Misra | B32B 15/017 |
| 2009/0168337 | A1 | 7/2009 | Conti et al. | |
| 2013/0321237 | A1 * | 12/2013 | Woodhull | C25D 11/34 156/60 |
| 2013/0322035 | A1 | 12/2013 | Hamburgen et al. | |
| 2017/0051426 | A1 | 2/2017 | Curran et al. | |
| 2018/0070465 | A1 | 3/2018 | Cater et al. | |
| 2018/0103557 | A1 | 4/2018 | Wright et al. | |
| 2019/0037721 | A1 | 1/2019 | Curran et al. | |
| 2020/0076058 | A1 | 3/2020 | Zhang et al. | |
| 2020/0245487 | A1 | 7/2020 | Counts et al. | |
| 2020/0347492 | A1 | 11/2020 | Tryon et al. | |
| 2021/0177115 | A1 * | 6/2021 | Brown | A45C 11/00 |
| 2023/0104743 | A1 | 4/2023 | Cheung et al. | |
| 2024/0284624 | A1 | 8/2024 | Counts et al. | |

OTHER PUBLICATIONS

Zhu et al. (CN 110662377 A); Jan. 7, 2020 (European Patent Office machine translation to English). (Year: 2020).*

Cramer et al. (DE 102004054931 A1); May 18, 2006 (European Patent Office machine translation to English). (Year: 2006).*

Partial International Search Report for International Application No. PCT/US2022/076741, mailed Jan. 19, 2023 (11 pp.).

PCT International Search Report and Written Opinion for PCT International Application No. PCT/US2022/076741, mailed Mar. 14, 2023 (20 pp.).

* cited by examiner

CLAD PARTS

CROSS-REFERENCE TO RELATED APPLICATION(S)

This application is a continuation of U.S. patent application Ser. No. 17/930,031, filed 6 Sep. 2022, and entitled "CLAD PARTS," which claims the benefit of U.S. Provisional Patent Application No. 63/261,588, filed 24 Sep. 2021, and entitled "METHOD FOR ELIMINATING GALVANIC CELL CHARACTERISTICS FOR CLAD PARTS," the disclosure of which is incorporated herein by reference in its entirety.

FIELD

The described embodiments relate generally to materials for housings, structures, and/or electronic devices. More particularly, the present embodiments relate to eliminating or preventing galvanic corrosion of the metal of clad parts.

BACKGROUND

Technology related to the use of dissimilar materials has become increasingly widespread throughout various industries and applications, including the portable computing and electronic device industries. For example, a housing for an electronic device can include a metal clad material having a lightweight interior metal within a more durable exterior metal. Since the weight of the device is important to consumers, it is desirable to have the clad material be mostly the lightweight material with a thin exterior shell of durable material.

However, one difficulty in the use of dissimilar metals is caused by galvanic corrosion. The phenomenon of galvanic corrosion is induced due to the difference in potentials of different metal materials when brought into contact in the presence of an electrolyte (e.g., water). In such a situation, a corrosion current is generated due to the difference in electric potentials of the dissimilar metal materials. When galvanic corrosion occurs, the strength of the contact point between the dissimilar metal materials weakens or the components of the clad material corrode, thereby causing unexpected damage.

Therefore, one way to prevent the galvanic corrosion is to ensure that only the more durable, more corrosion resistant, and more chemical resistant exterior metal is exposed to the electrolyte and the interior metal is protected. Unfortunately, this has the effect of having the material transition between the exterior metal and the interior metal farther away from the exterior of the device at least where there are openings in the external surface of the housing, resulting in a heavier product.

SUMMARY

According to some embodiments, a housing can include a clad material. The clad material can include an interior metal disposed within an exterior metal. In some examples, the exterior metal is different from the interior metal. The housing can further include a clad interface and a melt interface. The melt interface can include a layer of hardened flux disposed on a portion of the interior metal.

In some embodiments, the exterior metal can include a metal that is less susceptible to corrosion than the interior metal. The exterior metal can include stainless steel or titanium and the interior metal can include aluminum. In some embodiments, the exterior metal can include a uniform grain structure at the clad interface and a non-uniform grain structure at the melt interface. In some examples, the layer of hardened flux can include a thickness from about 100 μm to about 800 μm. The hardened flux can include an adhesion tensile strength greater than about 300 MPa. In some examples, the exterior metal proximal to the clad interface can include a hardness different than the exterior metal proximal to the melt interface. In some embodiments, the melt interface can include a tangential grain flow with respect to the clad interface.

According to some embodiments, a method of forming a protective interface in a housing can include having a clad interface disposed between an exterior metal and an interior metal. The exterior metal can include an outer surface and an inner surface. The method can include machining the interior metal to remove a portion of the interior metal that contacts the exterior metal, and forming an aperture in the exterior metal. In some examples, forming an aperture in the exterior metal can include forming a protective interface at an interior surface of the aperture adjacent to the interior metal.

In some examples, forming the aperture can include boring through the exterior metal from the outer surface with a thermal drill. In other examples, forming the aperture can include boring through the exterior metal from the inner surface with a thermal drill. In some examples, the method of forming a protective interface in the housing can further include forming a counterbore in the clad housing. In some examples, forming the aperture can include extruding the exterior metal through the removed portion of the interior metal. In other examples, forming the aperture can include machining a portion of the exterior metal from the inner surface and press fitting a slug into an opening formed by machining a portion of the exterior metal and machining the aperture through the slug.

In some embodiments, an interface disposed between the slug and the exterior metal can include a sealant. In some embodiments, a bond between the slug and the exterior metal can include at least one of a friction weld or a laser weld. In some embodiments, the slug can include a flange configured to secure the slug.

According to some embodiments, a system configured to prevent galvanic corrosion of a housing can include a clad structure having an exterior metal and an interior metal joined at an interface. In some examples, the interior metal defines an orifice at the interface. An insert can be disposed between the exterior metal and the interior metal within the orifice and an adhesive can be configured to bond the insert within the orifice. In some examples, an aperture can be formed through the clad structure and the insert. In some examples, the insert can include a metal or a plastic. In some examples, the insert can include a lobe extending from an exterior surface of the insert. The lobe can be configured to center the insert within an aperture. In some embodiments, the aperture can include a non-circular shape.

BRIEF DESCRIPTION OF THE DRAWINGS

The disclosure will be readily understood by the following detailed description in conjunction with the accompanying drawings, wherein like reference numerals designate like structural elements, and in which.

DETAILED DESCRIPTION

Figure 2A:
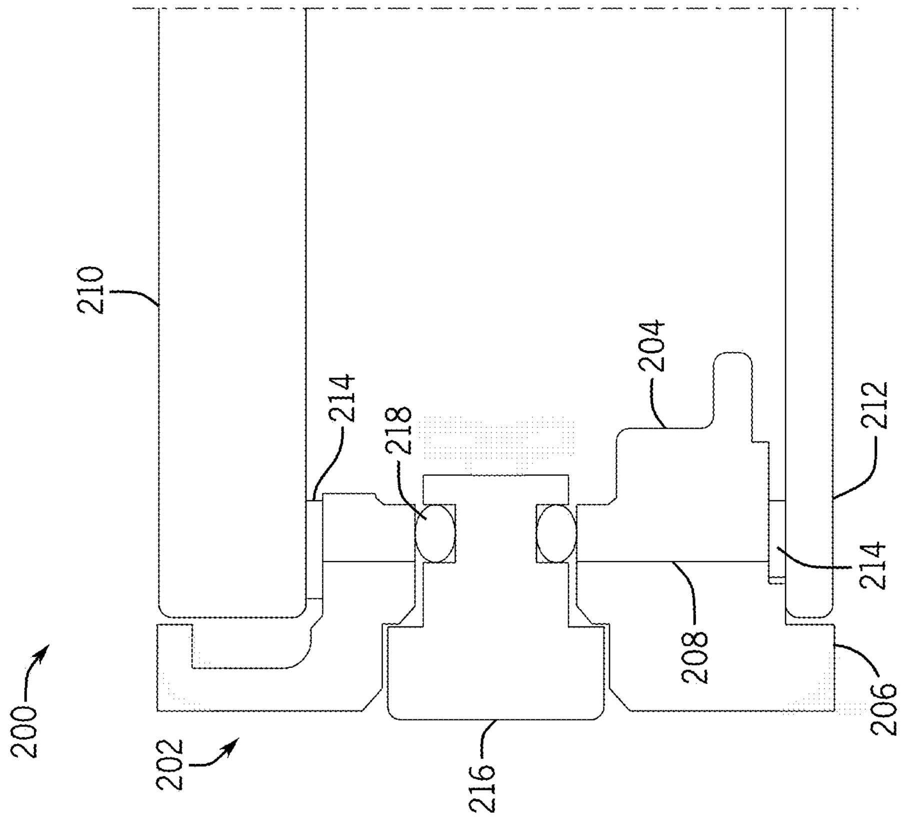
FIG. 2A illustrates a cross sectional view of a portion of an electronic device.

Reference will now be made in detail to representative embodiments illustrated in the accompanying drawings. It should be understood that the following descriptions are not intended to limit the embodiments to one preferred embodiment. To the contrary, it is intended to cover alternatives, modifications, and equivalents as can be included within the spirit and scope of the described embodiments as defined by the appended claims.

The following disclosure relates to a system that provides protection of a device from galvanic corrosion. In some embodiments, an electronic device can include a housing made of a clad material. In other words, the housing can include an exterior metal and an interior metal that is different from the exterior metal. When the electronic device having such a configuration is exposed to seawater, rainwater, sweat, or any other ingress of water from the outside into the device main body, the water may penetrate between openings on the exterior of the device and cause galvanic corrosion of the interior metal.

In a particular embodiment, the exterior metal can include a metal that is more corrosion resistant than the interior metal. In other words, the exterior metal can include a metal less susceptible to corrosion than the interior metal. As such, one way to prevent galvanic corrosion is to ensure that only the exterior metal is exposed to an electrolyte (e.g. water) and the interior metal is kept interior to the device in a watertight configuration. Generally, the exterior metal can be heavier than the interior metal. Thus, having the interface between the exterior metal and interior metal further away from the exterior surface of the device can result in a heavier device and weight can be an important aspect of consumer devices. In some embodiments, the weight reduction benefits can be achieved by having a thin exterior metal shell and the interior metal protected from the electrolyte in openings and susceptible regions by forming a new interface between the exterior metal and interior metal at the susceptible regions.

These and other embodiments are discussed below with reference to FIGS. 1-11. However, those skilled in the art will readily appreciate that the detailed description given herein with respect to these Figures is for explanatory purposes only and should not be construed as limiting. Furthermore, as used herein, a system, a method, an article, a component, a feature, or a sub-feature comprising at least one of a first option, a second option, or a third option should be understood as referring to a system, a method, an article, a component, a feature, or a sub-feature that can include one of each listed option (e.g., only one of the first option, only one of the second option, or only one of the third option), multiple of a single listed option (e.g., two or more of the first option), two options simultaneously (e.g., one of the first option and one of the second option), or combination thereof (e.g., two of the first option and one of the second option).

Figure 1:
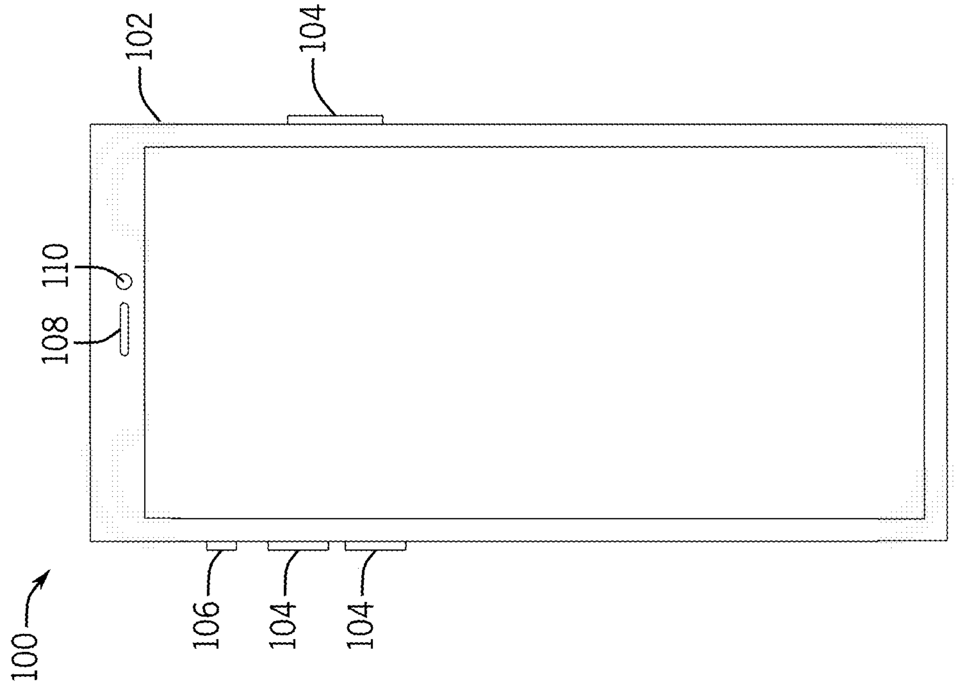
FIG. 1 illustrates a perspective view of an electronic device having a housing.

FIG. 1 illustrates a perspective view of an electronic device having a housing that can include the systems and techniques described herein, in accordance with some embodiments. FIG. 1 illustrates a smartphone 100, however, the systems and techniques are not limited to a particular device, but can be included in any suitable device (e.g. a phone, tablet computer, smart watch, portable computer, etc.). According to some embodiments, the housing 102 can include a clad material. As discussed above, in some embodiments, the housing 102 can include several openings and/or interfaces susceptible to an electrolyte (e.g. water, sweat) penetrating the exterior of the housing and causing corrosion to an interior metal and/or interior components. For example, as shown in FIG. 1, the housing 102 can include at least one button 104, switch 106, a speaker 108, a camera interface 110, etc.

In some embodiments, the housing 102 can include two metals that make up the clad material. The exterior metal can include a metal less susceptible to corrosion than the interior metal. The exterior metal can include a generally corrosion resistant metal (e.g. a high strength stainless steel, titanium, etc.) and the interior metal can include a metal more susceptible to galvanic corrosion that can be lighter in weight (e.g. aluminum, aluminum alloy, magnesium, magnesium alloy, beryllium, beryllium alloy, etc.) than the exterior metal. The exterior metal and the interior metal can include electrochemically dissimilar metals. Galvanic corrosion refers to corrosion damage that occurs when two different metals are in electrical contact in the presence of an electrolyte, where the more noble metal is protected and the more active metal tends to corrode. Designers of the housing 102 try to balance durability of the device with weight of the device. Consumers may prefer a device having a lighter weight, so designers can try to maximize the use of the lighter interior metal (e.g. the more active metal) in the housing.

FIG. 2A illustrates a cross sectional view of a portion of an electronic device 200, according to an embodiment. The electronic device 200 can include a housing 202 that includes a clad material having an interior metal 204 disposed within an exterior metal 206. The exterior metal 206 can be different from the interior metal 204. In some examples, the exterior metal 206 can include an alloy that is different from the interior metal 204. In other examples, the exterior metal 206 can include a treatment process (e.g. anodizing, PVD), coating process, (e.g. chemical conversion, painting, powder coating), or plating process (e.g. chrome, gold, or silver plating) that is not necessarily applied to the interior metal 204. In some embodiments, the exterior metal 206 includes a metal less susceptible to corrosion than the interior metal. In other words, the interior metal 204 can be subjected to galvanic corrosion, causing the interior metal 204 to fissure, erode, or lose strength.

The interior metal 204 and the exterior metal 206 can include a clad material. The interior metal 204 and the exterior metal 206 include an interface where the interior metal 204 and the exterior metal 206 contact. The interface can include a clad interface 208. The clad interface 208 can include a uniform grain structure of the interior metal 204 and the exterior metal 206 and a uniform contact surface. As shown in FIG. 2A, the housing 202 can further include components that cause openings into the interior of the electronic device 200. For example, a display 210 or backing 212 of the electronic device 200 (e.g. a screen) can be configured to contact the exterior metal 206 and/or the interior metal 204. The display 210 and/or backing 212 does not require any movement between the housing 202 and the display 210 and/or backing and thus can be sealed with an adhesive 214 at the interface of the housing 202 and the display 210 as well as the interface of the housing 202 and the backing 212. The adhesive 214 can be configured to seal the electronic device 200 and prevent any electrolyte from entering at the interface of the housing 202 and the display 210 and thus prevent any corrosion.

The housing 202 can further include a button 216. In some examples, the button 216 can be depressed and/or released. The button 216 of FIG. 2A is shown depressed. To keep the area inside the housing 202, in some examples, an O-ring 218 can be included. The O-ring 218 can be configured to seal the housing 202 and prevent exposure of the interior metal 204 to an electrolyte and prevent galvanic corrosion of the interior metal 204. However, as shown in FIG. 2A, in some embodiments, when the button 216 is depressed, the O-ring 218 is disposed interior to the clad interface 208 and a portion of the interior metal 204 can be exposed to the electrolyte. In some examples, when the button 216 is depressed the area interior to the O-ring 218 remains water tight, but the exposure of the interior metal 204 can cause galvanic corrosion of the housing 202.

Figure 2C:
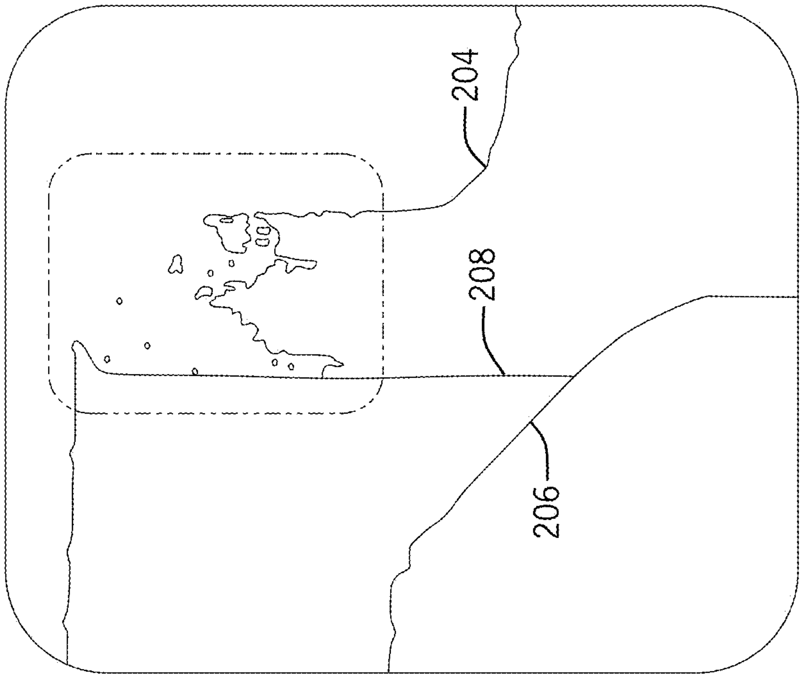
FIGS. 2B-2C illustrate a cross sectional view of a portion of an electronic device showing an interior metal susceptible to galvanic corrosion.
Figure 2B:
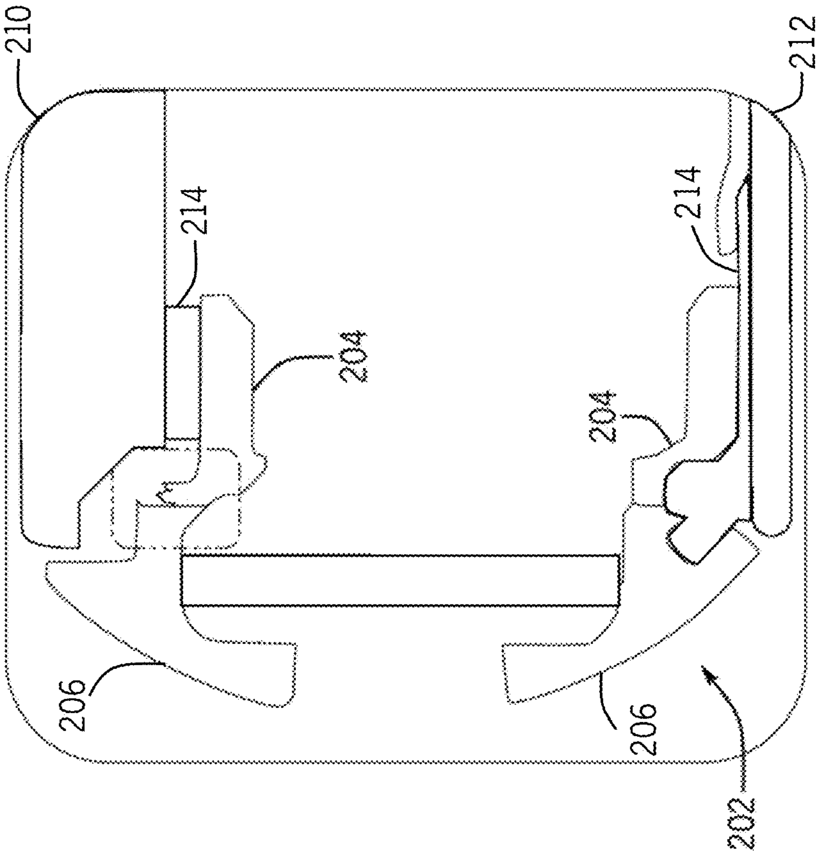

FIGS. 2B-2C illustrate a cross sectional view of a portion of the electronic device 200 showing the interior metal 204 susceptible to galvanic corrosion. FIG. 2C is an enlarged portion of FIG. 2B to better illustrate the potential effects of galvanic corrosion on the interior metal 204 when exposed to an electrolyte. Galvanic corrosion, also known as bimetallic corrosion, is an electrochemical process whereby one metal corrodes in preference to another metal that it is in contact with through an electrolyte. Galvanic corrosion occurs when two dissimilar metals are disposed in a conductive solution and are electrically connected. One metal (the cathode, e.g. the exterior metal 206) can be protected, whilst the other (the anode, e.g. the interior metal 204) is subject to corrosion. The rate of attack on the anode can be accelerated, compared to the rate of attack when the metal is uncoupled from the exterior metal 206.

Figures 3A, 3B, 3C:
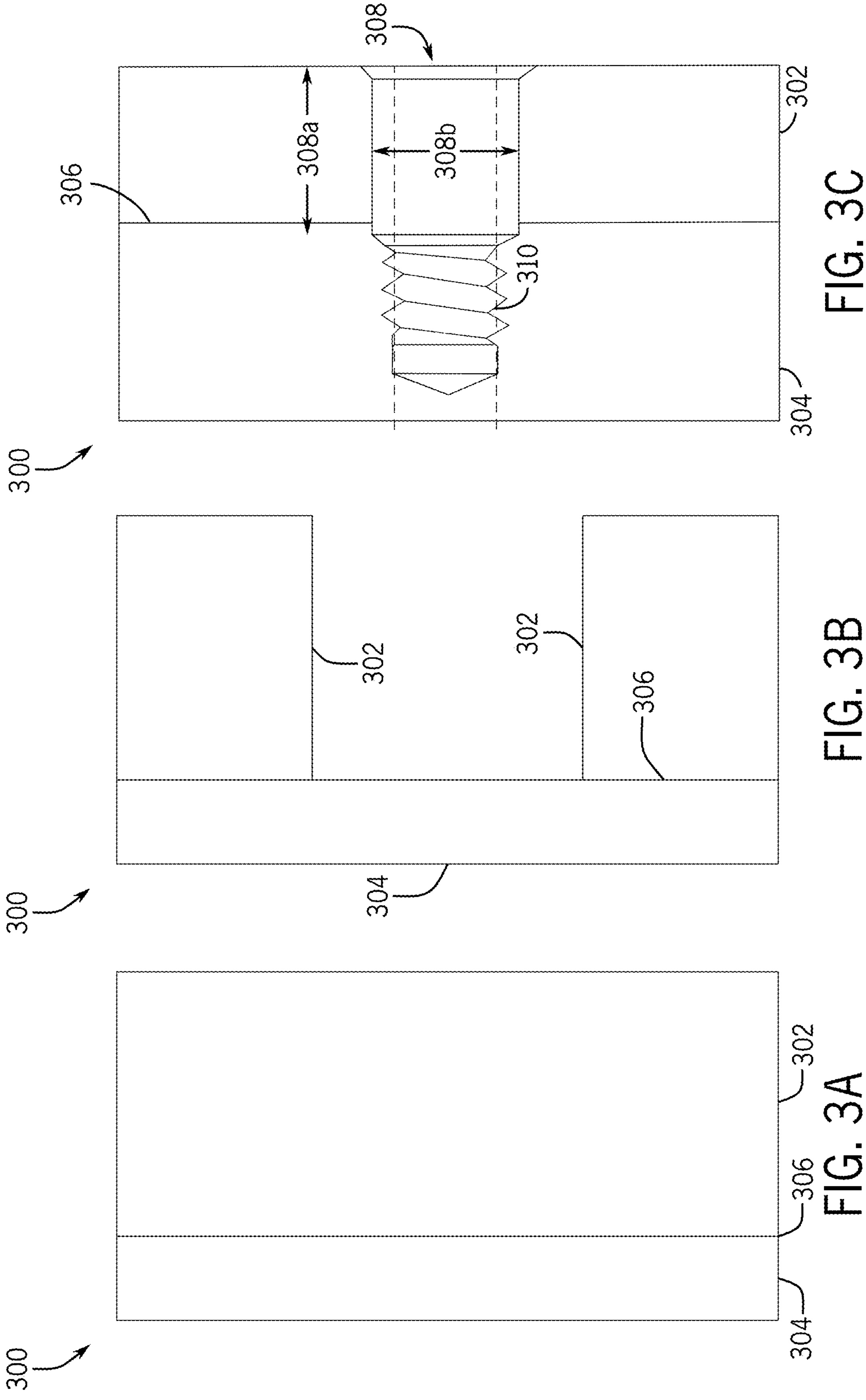
FIG. 3A illustrates a cross sectional view of a clad material having an interior metal disposed within an exterior metal.
FIG. 3B illustrates the clad material of FIG. 3A with the interior metal machined to remove a portion of the interior metal that contacts the exterior metal.
FIG. 3C illustrates clad material of FIG. 3A with the interior metal machined to remove a portion of the interior metal that contacts the exterior metal, and the exterior metal machined to include screw threads.

FIG. 3A illustrates a cross sectional view of a clad material 300 having an interior metal 302 disposed within an exterior metal 304, according to an embodiment. As described briefly above, an advantage of clad material is the material combines the superior properties of each metal. For example, strength, corrosion resistance, lightweight, cost, thermal and electrical conductivity can be improved by including a clad material within a housing. As a result, clad products produce a material superior to the individual metals taken alone. In some examples, the clad material 300 can be manufactured by roll bonding the interior metal 302 with the exterior metal 304 to produce a metallurgically bonded clad interface 306. Many metals can be combined with this technique to provide a custom metal with specific desired properties. In some embodiments, the exterior metal 304 can include stainless steel or titanium and the interior metal 302 can include aluminum, aluminum alloys, magnesium, magnesium alloys, beryllium, beryllium alloys, or any other suitable metal. In some embodiments, the exterior metal can include a uniform grain structure at the clad interface 306.

In some embodiments, roll bonding can be achieved by processing the interior metal 302 and exterior metal 304 through a conventional plate hot rolling mill that reduces the thickness and metallurgically bonds the interior metal 302 to the exterior metal 304. The clad material 300 can be fabricated into different shapes, which allows designers the freedom to produce a variety of devices (e.g. a housing for an electronic device). Clad material 300 can be cut and formed by most shop operations, which include shearing, plasma cutting, drawing, bending, hot forming, machining, drilling and punching.

FIG. 3B illustrates the clad material 300 of FIG. 3A with the interior metal 302 machined to remove a portion of the interior metal 302 that contacts the exterior metal 304, according to an embodiment. In other words, interior metal 302 can be processed to produce a machined surface. A manufacturing/machining process produces a surface characterized by the shape (topography), metallurgy, and mechanical properties. In some examples, the surface aspects can indicate that a machined surface includes complex portions and includes a system of interrelated features that influence the surface functional performance. Machining is a manufacturing term encompassing a broad range of technologies and techniques. It can be roughly defined as the process of removing material from the clad material 300 using machine tools to shape it into an intended design. FIG. 3B is a machined surface of the interior metal 302 that has been removed through the entire thickness of the interior metal 302. In other words, the interior metal 302 is machined to the clad interface 306. The techniques and method to form the systems to prevent galvanic corrosion can include the machined clad material 300 as the initial material for forming an additional interface that can protect the interior metal 302.

FIG. 3C illustrates the clad material 300 of FIG. 3A with the interior metal 302 machined to remove a portion of the interior metal 302 that contacts the exterior metal 304 and further machined to remove a portion of the exterior metal 304, according to an embodiment. The interior metal 302 can be predrilled through the clad interface 306 and into the exterior metal 304. In some examples, the interior metal 302 can be further machined to expand the portion of the interior metal 302 that is removed to form a counterbore 308. In some examples, the counterbore 308 can include a counterbore depth 308*a* that extends past the clad interface 306 and into the exterior metal 304.

The counterbore depth 308*a* can be machined such that a screw thread 310 is formed only in the exterior metal 304. In some examples, the exterior metal 304 can include a stronger and more durable metal (e.g. stainless steel) and the interior metal 302 can include a lighter but softer metal (e.g. aluminum) that can be more susceptible to deforming screw threads, thread failure, and/or cross-threading than the exterior metal 304. Because the counterbore depth 308*a* extends farther than the interior metal 302, there is less likelihood of thread deformation.

In some examples, the counterbore 308 can include a counterbore diameter 308*b* that limits the insertion angle of a screw when the screw contacts the screw thread 310. In some examples, the counterbore diameter 308*b* is narrow relative to the diameter of the screw to reduce the insertion angle and minimize the likelihood of cross threading. For example, the counterbore depth 308*a* and the counterbore diameter 308*b* can be configured to limit the insertion angle of the screw to a maximum of approximately 3° variation relative to a centerline of the counterbore 308. In other examples, the insertion angle of a screw can be further limited to less than 3°. Because the counterbore diameter 308*b* is formed to reduce the insertion angle, the likelihood of cross threading is also significantly reduced relative to a threaded orifice without a counterbore.

Figure 4B:
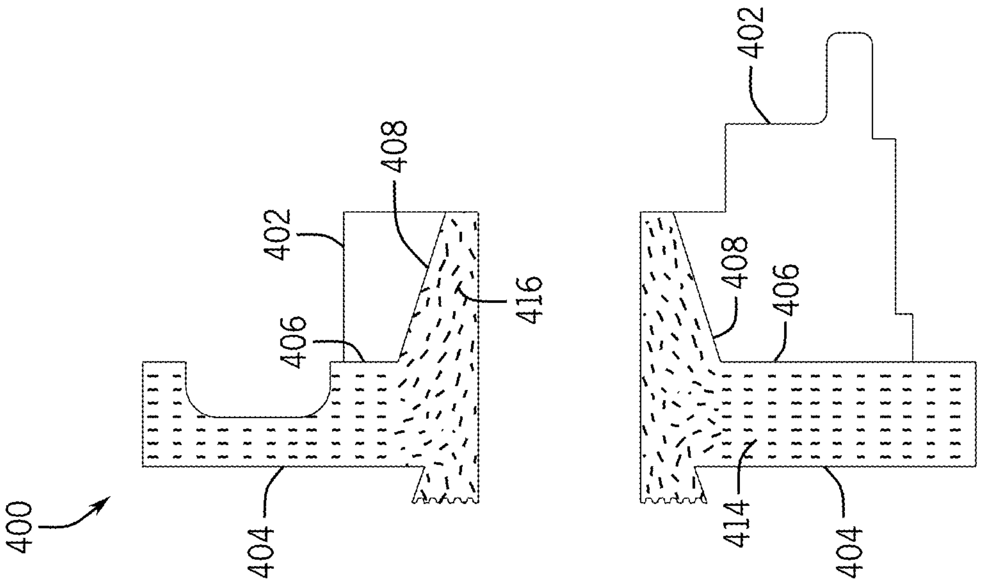
FIG. 4B illustrates the clad material of FIG. 4A with the exterior metal and the interior metal partially machined.
Figure 4A:
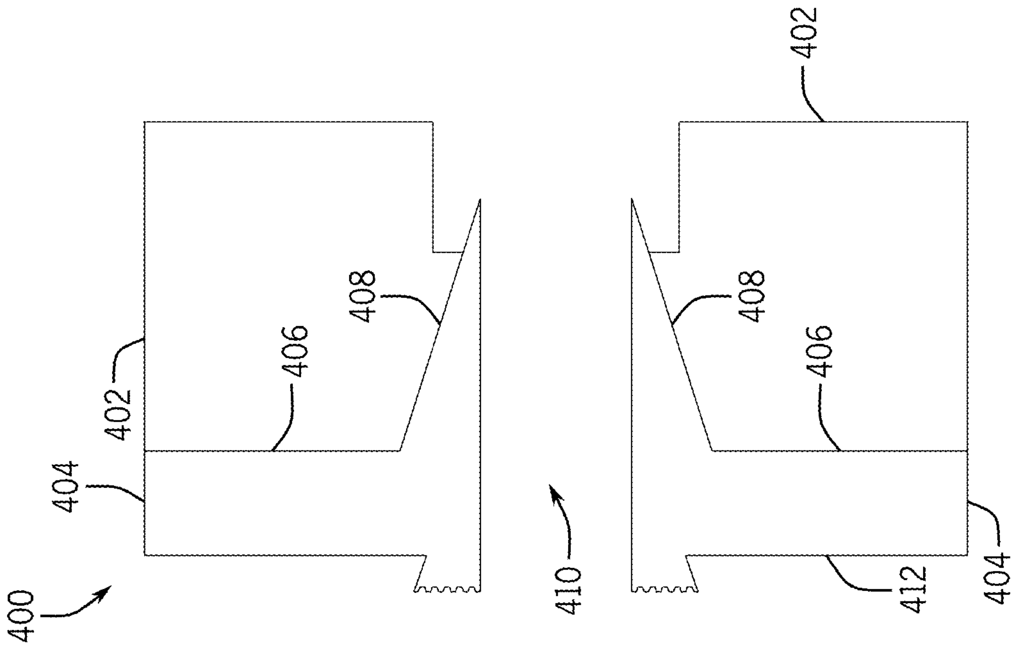
FIG. 4A illustrates a cross sectional view of a clad material having an aperture formed in an exterior metal with a thermal drill boring through the exterior metal from an outer surface.

FIG. 4A illustrates a cross sectional view of a clad material 400 having an aperture formed in an exterior metal with a thermal drill boring through the exterior metal from an outer surface, according to an embodiment. The clad material 400 can include an interior metal 402 and an exterior metal 404. In some embodiments, the interior metal 402 can be disposed within the exterior metal 404. The exterior metal 404 can be different (e.g. different electrode potential) than the interior metal 402. The clad material 400 can include a clad interface 406 where the interior metal 402 and the exterior metal 404 contact. In some embodiments, the clad material 400 can further include a melt interface 408. In some examples, the melt interface 408 can include a layer of hardened flux disposed on a portion of the interior metal 402. In some examples, the hardened flux refers to a metal that was heated to a different state (e.g. a liquid state) and then allowed to cool and harden. In other words, the hardened flux includes a layer of metal that was heated above the melting point and then cooled below the melting point. For example, the melt interface 408 can include a hardened flux formed from a melted portion of the exterior metal 404 flowing over a surface of the interior metal 402. In some examples, the hardened flux can be heated by friction and/or extrusion and then cooled by withdrawing the friction device or concluding the extrusion process.

In some examples, the exterior metal 404 can include a corrosion resistant metal (e.g. stainless steel) and the interior metal 402 can include a metal more susceptible to corrosion (e.g. aluminum) than the exterior metal 404. The clad interface 406 and the melt interface 408 can prevent exposure of the interior metal 402 to an electrolyte and prevent galvanic corrosion of the interior metal 402. In some embodiments, the melt interface 408 can include a high adhesion strength between the exterior metal 404 and the interior metal 402.

In some examples, the clad material 400 can include an aperture 410. The aperture 410 can penetrate both the exterior metal 404 and the interior metal 402. In some embodiments, a thermal drill extending through the exterior metal 404 from an outer surface 412 of the clad material 400 can form the aperture 410. In some examples, the thermal drill uses friction to produce the aperture 410. The combined rotational and downward force of an example thermal drilling tool bit can create frictional heat. In an example, the exterior metal 404 is transformed into a "super-plastic" state, allowing the tool to displace the exterior metal 404 material and form the melt interface 408. The length of the melt interface can include roughly 3 to 4 times the original thickness of the exterior metal 404. Thermal drills can be used in most ferrous and non-ferrous metals including raw steel, stainless steel, copper, brass, and aluminum having material thickness up to 12 mm. In general, all malleable materials can be thermal drilled. In some embodiments, the exterior metal 404 can include a thickness from about 100 μm to about 800 μm at the melt interface 408. In some examples, the external metal 404 at the melt interface 408 can include a thickness greater than about 100 μm. In some embodiments, the external metal 404 at the melt interface 408 can be about 100 μm in thickness or greater, about 200 μm in thickness or greater, about 300 μm in thickness or greater, about 400 μm in thickness or greater, about 500 μm in thickness or greater, about 600 μm in thickness or greater, about 700 μm in thickness or greater, or in thickness ranges of about 100 μm to about 200 μm, about 200 μm to about 300 μm, about 300 μm to about 400 μm, about 400 μm to about 500 μm, about 500 μm to about 600 μm, about 600 μm to about 700 μm, or about 700 μm to about 800 μm. After the aperture 410 is included in the clad material 400, the clad material can be further machined to form the clad material as required by an example design.

FIG. 4B illustrates the clad material 400 of FIG. 4A with the exterior metal 404 and the interior metal 402 partially machined. In some embodiments, the exterior metal 404 can include a uniform grain structure 414 at the clad interface 406. Generally, the inner structure of a metal (e.g. exterior metal 404) is made up of individual crystalline areas known as grains. The structure, size and orientation of these grains result from the material composition (alloy) and the way the material is made. In some embodiments, the exterior metal 404 can include stainless steel. The "super-plastic" state formed in the exterior metal 404 at the melt interface 408 can cause the grains of the exterior metal 404 to be non-uniform. Thus, the exterior metal 404 can include a non-uniform grain structure 416 at the melt interface 408. In some embodiments, the non-uniform grain structure 416 causes the exterior metal 404 at the melt interface 408 to soften after the exterior metal 404 cools from the "super-plastic" state. In other words, the exterior metal 404 proximal to the clad interface 406 can include a hardness different than the exterior metal 404 proximal to the melt interface 408. In some embodiments, the hardness of the exterior metal 404 proximal to the clad interface 406 can be greater than the exterior metal 404 proximal to the melt interface. In other embodiments, the hardness of the exterior metal 404 proximal to the clad interface 406 can be less than the exterior metal 404 proximal to the melt interface In some embodiments, the melt interface 408 can include an angle between about a 45° and about a 90° with respect to the clad interface 406. The angle between the melt interface 408 and the clad interface 406 can vary due to the formation of the melt interface 408 when the exterior metal 404 is in the super-plastic state. In some embodiments, the melt interface 408 can include a tangential grain flow with respect to the clad interface 406. In some embodiments, the melt interface 408 can include an adhesion tensile strength greater than about 300 MPa. Different techniques of forming a melt interface between the exterior metal and interior metal can result in different properties of angles and adhesion strength. In some examples, the melt interface 408 can be threaded to include screw threads or other fastener securement features.

Figures 5A, 5B, 5C:
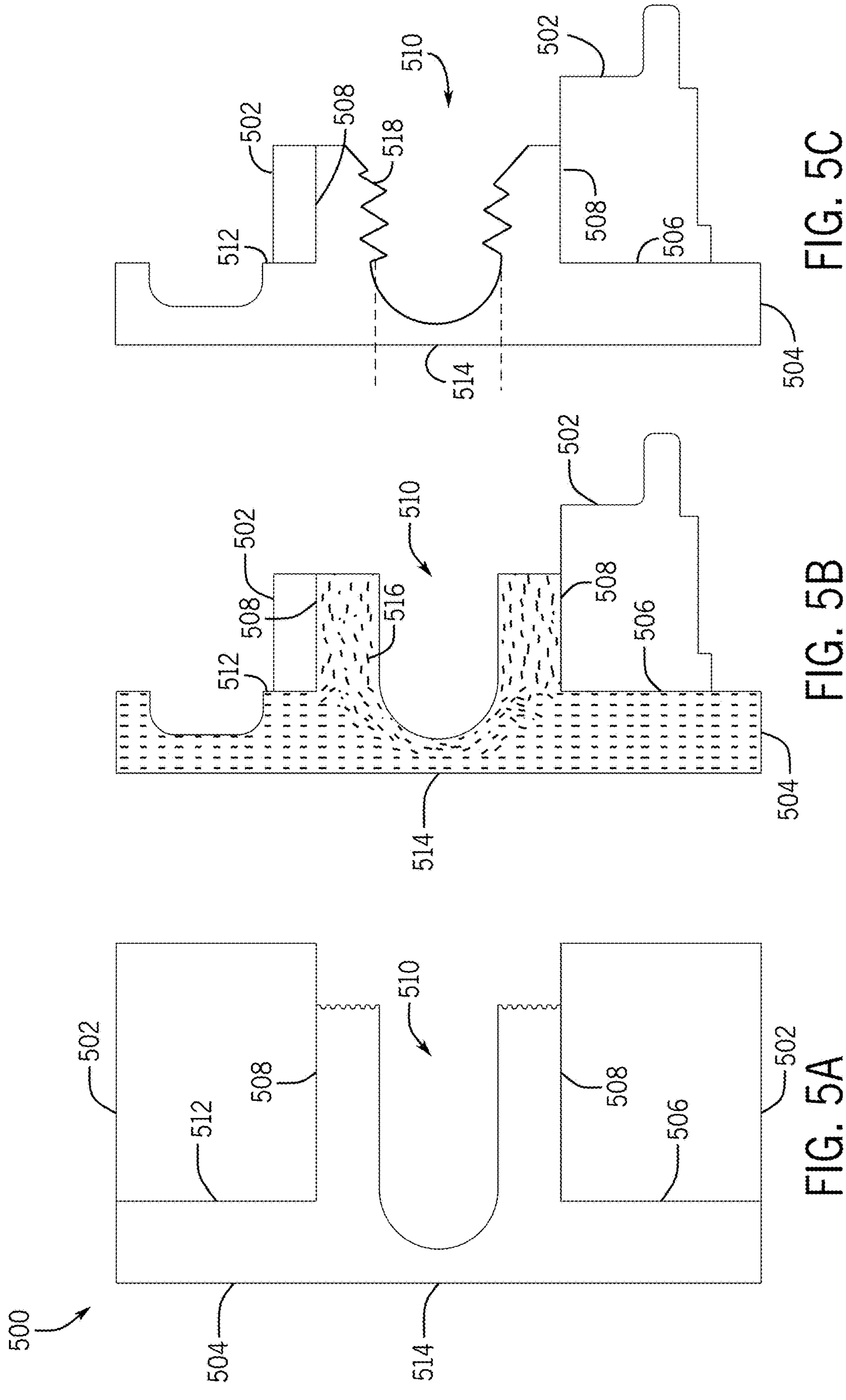
FIG. 5A illustrates a cross sectional view of a clad material having an aperture formed in an exterior metal with a thermal drill boring through the exterior metal from an inner surface.
FIG. 5B illustrates the clad material of FIG. 5A with the exterior metal and the interior metal partially machined.
FIG. 5C illustrates the clad material of FIG. 5A with the exterior metal and the interior metal partially machined, and the exterior metal machined to include screw threads.

FIG. 5A illustrates a cross sectional view of a clad material 500 having an aperture formed in an exterior metal with a thermal drill boring through the exterior metal from an inner surface, according to an embodiment. The clad material 500 can include an interior metal 502 and an exterior metal 504. Similar to the embodiments shown in FIGS. 4A-4B, the clad material 500 can include a clad interface 506 where the interior metal 502 and the exterior metal 504 contact. In some embodiments, the clad material 500 can further include a melt interface 508. In some examples, the melt interface 508 can include a layer of hardened flux disposed on a portion of the interior metal 502. In some examples, a thermal drill uses friction to produce a blind aperture 510. A blind aperture 510 can be defined as an aperture or hole drilled into the exterior metal 504 from an inner surface 512 with the aperture or hole not going through an outer surface 514 of the exterior metal 504. In some examples, as shown in FIG. 5A, a thermal drill extending into, but not entirely through, the exterior metal 504 from an outer surface 514 of the clad material 500 can form the aperture 510. In some examples, the thermal drill uses friction to produce the aperture 510. The exterior metal 504 is transformed into a "super-plastic" state, allowing the tool to displace the exterior metal 504 material and form the melt interface 508.

FIG. 5B illustrates the clad material 500 of FIG. 5A with the exterior metal 504 and the interior metal 502 partially machined. Similar to the clad material 400 shown in FIGS. 4A-4B above, the "super-plastic" state formed in the exterior metal 504 at the melt interface 508 can cause the grains of the exterior metal 504 to be non-uniform. Thus, the exterior metal 504 can include a non-uniform grain structure 516 at the melt interface 508. In some embodiments, the melt interface 508 can include a tangential grain flow with respect to the clad interface 506. In some embodiments, the non-uniform grain structure 516 causes the exterior metal 504 at the melt interface 508 to soften after the exterior metal 504 cools from the "super-plastic" state. In some examples, the remaining portion of the exterior metal 504 located at the blind aperture 510 can be machined away at a later stage in the design process. As such, the melt interface 508 can include an angle closer to 90° or at least between about a 45° and about a 90° with respect to the clad interface 506.

FIG. 5C illustrates the clad material 500 of FIG. 5A with the exterior metal 504 and the interior metal 502 partially machined, and the exterior metal 504 further machined to include screw threads. In some examples, the clad material 500 further includes the melt interface 508 that can include a layer of hardened flux disposed on a portion of the interior metal 502. A thermal drill can be used to produce the blind aperture 510. The thermal drill can extend into, but not entirely through, the exterior metal 504 from an outer surface 514 of the clad material 500 and can form the aperture 510. In other words, the aperture 510 can extend past the clad interface 506 from an inner surface 512, but does not extend through the exterior metal 504. In some examples, the aperture 510 can be threaded to form screw threads 518. The melt interface 508 is formed from the stronger and more durable exterior metal 504 to minimize the likelihood of deforming screw threads, thread failure, and/or cross-threading compared to the interior metal 302. Because the threads are included in the melt interface 508 of the exterior metal 504, there is less likelihood of thread deformation. In some examples, the melt interface 508 can include other fastener securement features in place of screw threads. Furthermore, in some examples detailed below with reference to FIGS. 6A-6B, the aperture 510 can extend entirely through the clad material 500, and the screw threads can be formed throughout the aperture, allowing a fastener to be inserted from either side of the aperture. Further details of the through-aperture are provided below with reference to FIGS. 6A-6B.

Figure 6B:
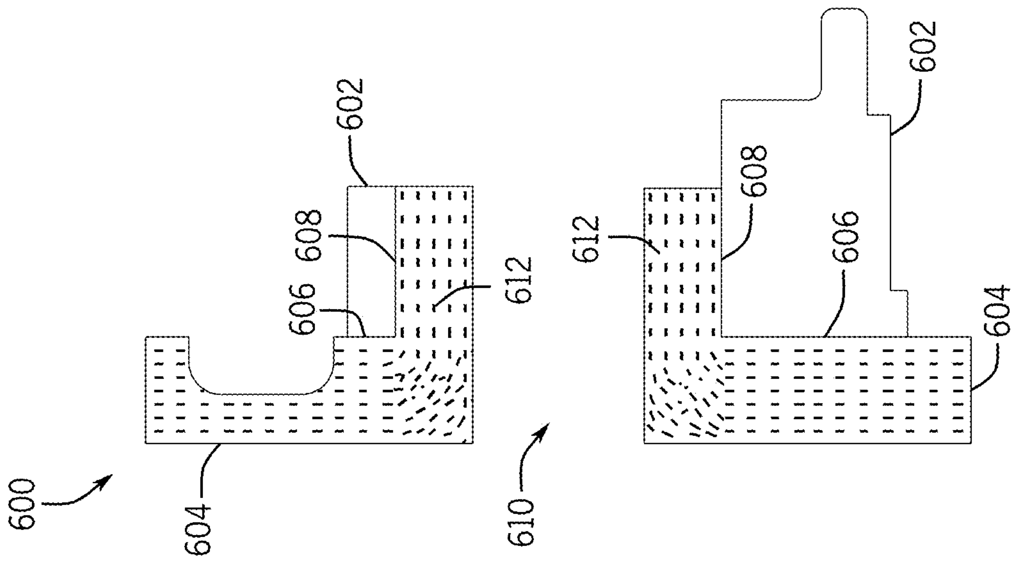
FIG. 6B illustrates the clad material of FIG. 6A with the exterior metal and the interior metal partially machined.
Figure 6A:
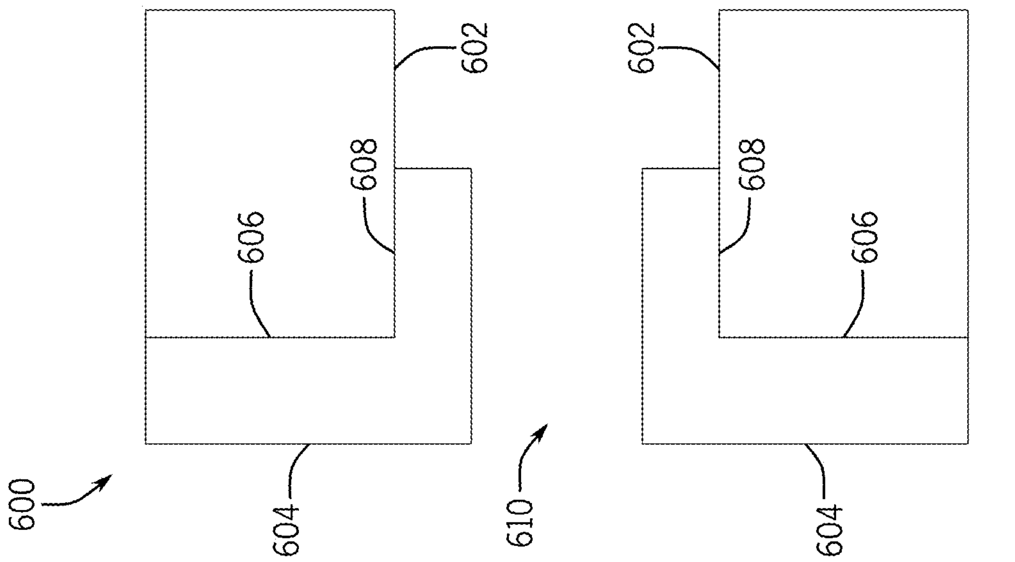
FIG. 6A illustrates a cross sectional view of a clad material having an aperture formed in an exterior metal by extruding the exterior metal through a removed portion of the interior metal.

FIG. 6A illustrates a cross sectional view of a clad material 600 having an aperture formed in an exterior metal by extruding the exterior metal through a removed portion of the interior metal, according to an embodiment. The clad material 600 can include an interior metal 602 and an exterior metal 604. Similar to the embodiments shown in FIGS. 4A-4B and FIGS. 5A-5B, the clad material 600 can include a clad interface 606 where the interior metal 602 and the exterior metal 604 are in contact. In some embodiments, the clad material 600 can further include a protective interface 608. In an example, the protective interface 608 is formed from an extrusion process. Metal Extrusion is a metal forming manufacturing process in which a billet inside a closed cavity is forced to flow through a die of a desired cross-section. The metal extrusion process is widely used today, thanks to a fast and high production rate, and low cost. Furthermore, both hot and cold metal extrusion processes can be used. The cross section of exterior metal 604 produced will be uniform over the entire length of the metal extrusion. In some examples, an aperture 610 can be formed as a hollow in the extrusion process or can be machined in a later step of the process.

FIG. 6B illustrates the clad material 600 of FIG. 6A with the exterior metal 604 and the interior metal 602 partially machined. As shown in FIG. 6B, in some embodiments, the extruded protective interface 608 can include a more uniform grain structure 612 than other methods. In some examples, the extruded protective interface 608 can be threaded to include screw threads or other fastener securement features. In some examples, the adhesion tensile strength of the extruded protective interface 608 can be less than the melt interface of other methods (e.g. the melt interface of FIG. 4A-4B). In some embodiments, the extruded protective interface can be a gap between the interior metal 602 and an exterior metal 604. However, the aperture 610 can include a non-circular shape. Other advantages of extrusion to from the protective interface 608 can include uniformity, costs, and speed of production. Other benefits can be provided through other manufacturing processes.

Figure 7C:
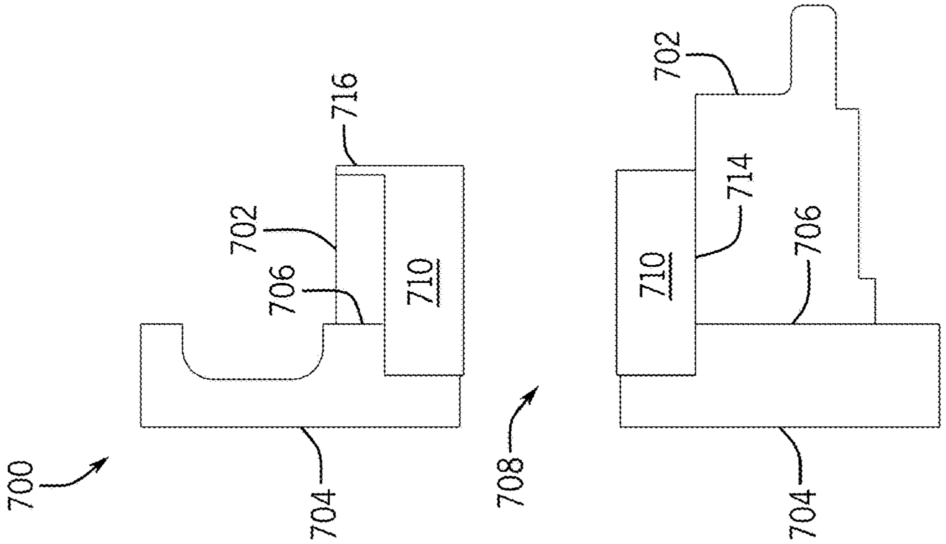
FIG. 7C illustrates the clad material of FIGS. 7A-7B with the exterior metal and the interior metal partially machined and an aperture machined through the slug.
Figure 7B:
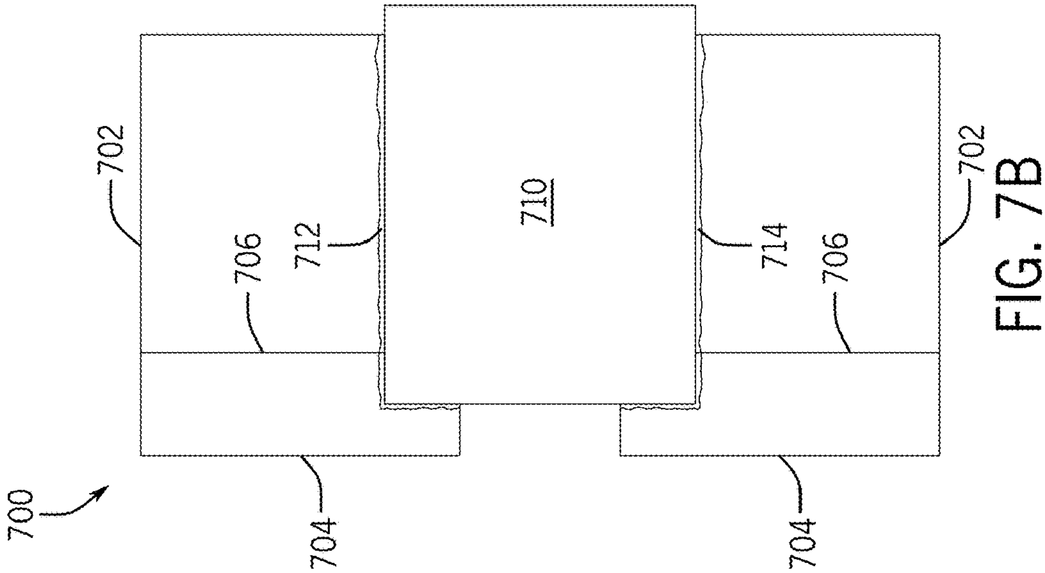
FIG. 7B illustrates the clad material of FIG. 7A with a slug press fit into the machined portion of the exterior metal.
Figure 7A:
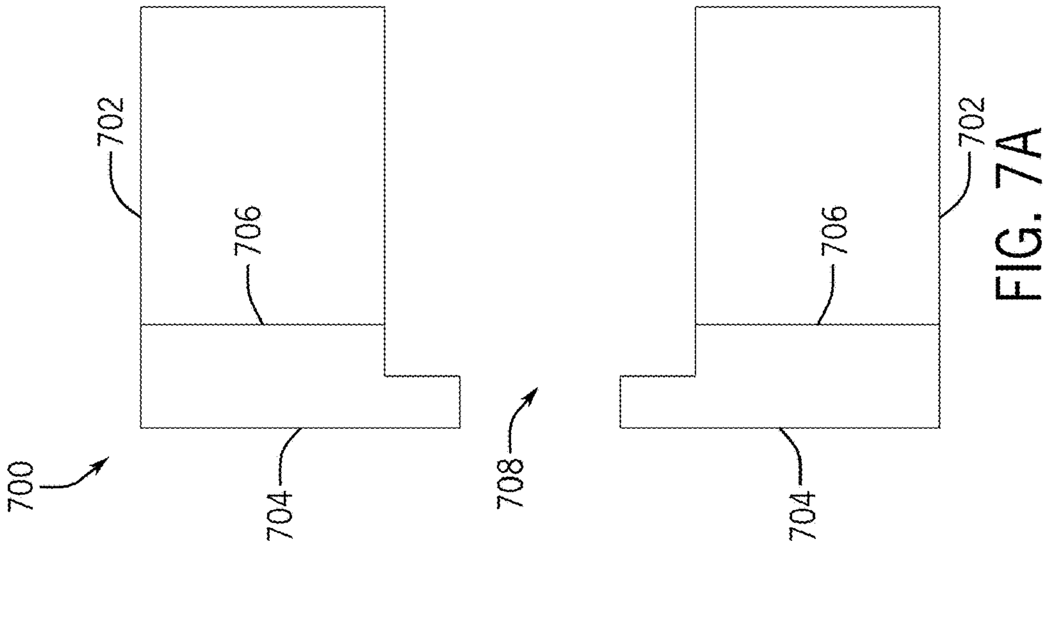
FIG. 7A illustrates a cross sectional view of a clad material having an aperture formed in an exterior metal by machining a portion of the exterior metal and having a removed portion of the interior metal.

FIG. 7A illustrates a cross sectional view of a clad material 700 having an aperture formed in an exterior metal by machining a portion of the exterior metal and having a removed portion of the interior metal, according to an embodiment. The clad material 700 can include an interior metal 702 and exterior metal 704 similar to the above embodiments. In an example, the interior metal 702 can be machined to remove a portion of the interior metal 702 that contacts the exterior metal 704, according to an embodiment. A portion of the exterior metal 704 can also be machined. The clad material 700 can include a clad interface 706 where the interior metal 702 and the exterior metal 704 are in contact. The clad material 700 can further include an aperture 708 extending through the exterior metal 704. The aperture 708 can include a smaller diameter than the machined portion of the exterior metal 704. The aperture 708 can be machined, cut, or formed using any suitable method.

FIG. 7B illustrates the clad material 700 of FIG. 7A with a slug 710 press fit into the machined portion of the exterior metal 704. In some examples, the slug 710 can include the same metal as the exterior metal 704. In some examples, the slug 710 can include any other suitable metal or non-metal (e.g. plastic or ceramic). In some examples, the slug 710 can include a non-circular shape. The slug 710 can include geometric features (e.g. grooves or teeth) around a circumference of the slug 710 to interlock within the interior metal 702 and/or the exterior metal 704. In some embodiments, an interface disposed between the slug 710 and the exterior metal 704 and/or interior metal 702 can include a sealant 712. The sealant 712 can include an epoxy or polymer sealant. The sealant 712 can include silicone or any other suitable sealant. In some embodiments, the interface disposed between the slug 710 and the exterior metal 704 and/or interior metal 702 can include a protective interface 714. In some examples, a bond between the slug 710 and the exterior metal 704 can include at least one of a friction weld or a laser weld. Friction welding generates heat through mechanical friction between the slug 710 and the exterior material 704 and/or the interior material 702 in relative motion to one another, with the addition of a lateral force called "upset" to plastically displace and fuse the materials. Laser welding is a process used to join metals using a laser beam to form a weld and can be practiced using previously known methods.

FIG. 7C illustrates the clad material 700 of FIGS. 7A-7B with the exterior metal 704 and the interior metal 702 partially machined and the aperture 708 machined through the slug 710. In some examples, the walls of the aperture 708 formed from the slug 710 can be tapped or otherwise machined to forms threads, such as screw threads or other fastener securement features. In some examples, the slug 710 can include a flange 716 configured to secure the slug 710 within the machined portion of the exterior metal 704. In some embodiments, a portion of the slug 710 can include a flange 716. As shown in FIG. 7C, the protective interface 714 can include an angle closer to 90° or at least between about a 45° and about a 90° with respect to the clad interface 706. In other words, the interface disposed between the slug 710 and the exterior metal 704 and/or interior metal 702 can include about a 90° angle with respect to the clad interface 706.

Figure 8:
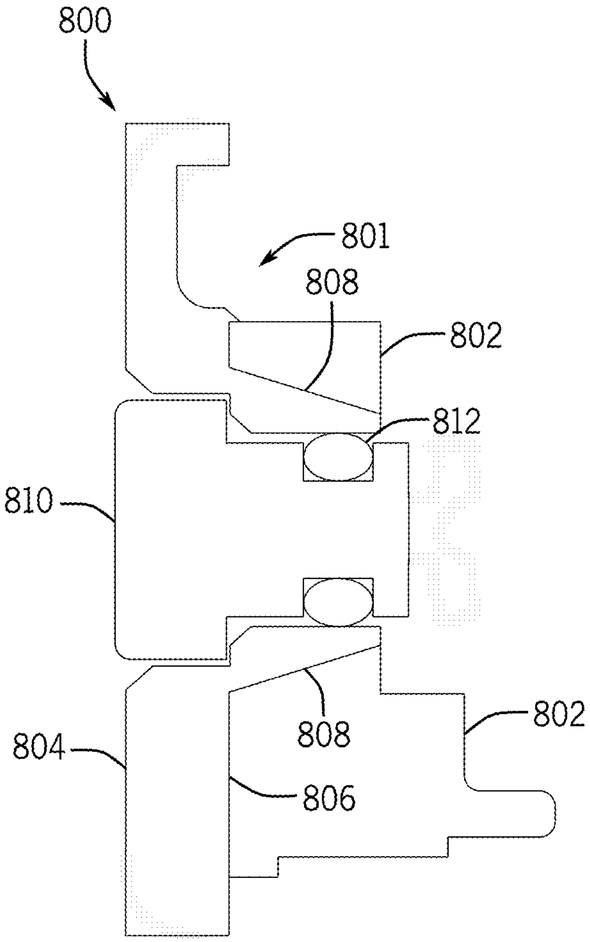
FIG. 8 illustrates a cross sectional view of a clad material having an aperture with a depressed button disposed within the aperture and a protective interface formed between the interior metal and the exterior metal at a perimeter of the aperture.

As noted briefly above, the aperture within the housing can be made to fit various features to be included on the housing (e.g. button, switch, etc.). FIG. 8 illustrates a cross sectional view of a housing 800 having clad material 801 and an aperture with a depressed button disposed within the aperture and a protective interface formed between the interior metal and the exterior metal at a perimeter of the aperture, according to an embodiment. Similar to the embodiments above, the clad material 801 can include an interior metal 802 and exterior metal 804. The clad material 801 can include a clad interface 806 where the interior metal 802 and the exterior metal 804 are in contact. In some embodiments, the clad material 801 can further include a protective interface 808. The housing 800 can further include a button 810. In some examples, the button 810 can be depressed and/or released. The button 810 of FIG. 8 is shown depressed. To keep the area inside the housing 800, in some examples, an O-ring 812 can be include. The O-ring 812 can be configured to seal the housing 800 and prevent exposure of the interior metal 804 to an electrolyte and prevent galvanic corrosion of the interior metal 804. In contrast to the embodiment shown in FIG. 2A, when the button 810 is depressed, the protective interface 808 ensures the interior metal 802 is not exposed to an electrolyte. The interior metal 802 remains within the watertight portion of the housing 800 and is protected by the exterior metal 804 and/or the O-ring 812. Any of the housings and/or clad material systems discussed above with reference to FIGS. 3A-7C can be included in the housing alone or in combination to eliminate galvanic corrosion.

Figure 9:
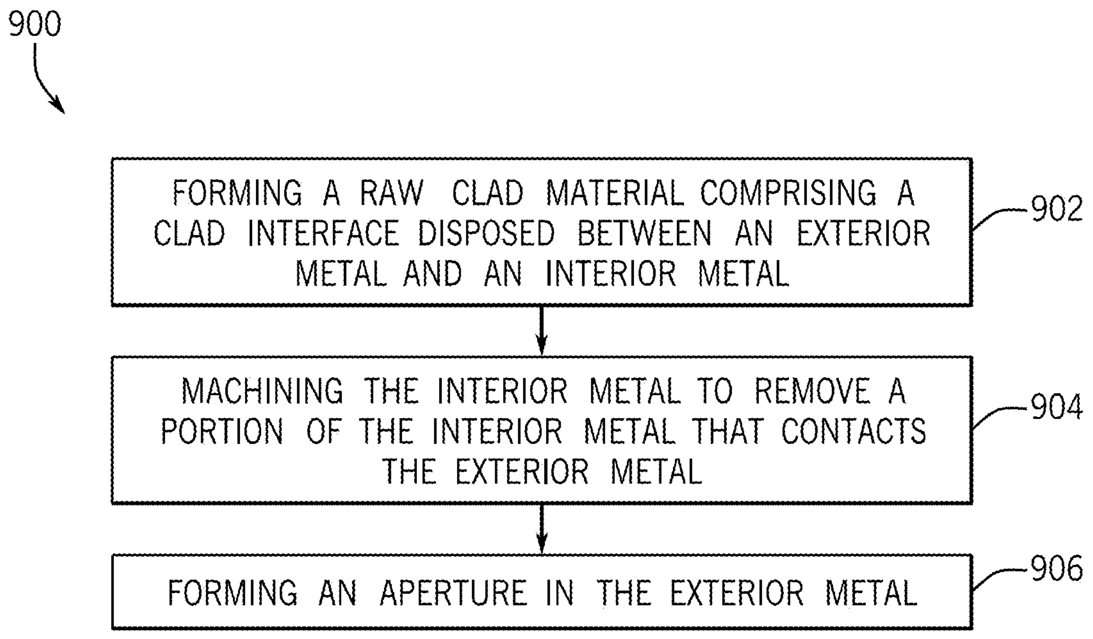
FIG. 9 illustrates a method of forming a protective interface in a housing.

FIG. 9 illustrates a method 900 of forming a protective interface in a clad housing, according to an embodiment. In some embodiments, the method 900 can include forming a raw clad material as shown in block 902. The raw clad material can be formed by roll bonding, press fitting, extrusion, or any other suitable method known in the art. In some embodiments, the raw clad material can include an interior metal disposed within an exterior metal. In some embodiments, the clad material can be pre-formed such that the clad housing includes a clad interface disposed between the exterior metal and the interior metal. The raw clad material can include a clad interface disposed between an exterior metal and an interior metal; the exterior metal can include an outer surface and an inner surface.

At block 904, the method can include machining the interior metal to remove a portion of the interior metal that contacts the exterior metal. The machining can create a portion of the raw clad material having only the exterior metal included. At block 904, the method can further include machining the interior metal as required by the design of the interior of the housing.

The method can further include forming an aperture in the exterior metal as shown at block 906. In some embodiments, a protective interface can be formed between the interior metal and the exterior metal adjacent to the interior metal. The protective interface can prevent exposure of the interior metal to an electrolyte and prevent galvanic corrosion of the interior metal. In some embodiments, forming the aperture can include boring through the exterior metal from the outer surface with a thermal drill. In some examples, the thermal drill forms the protective interface by heating and displacing a portion of the exterior metal. In other examples, forming the aperture can include boring through the exterior metal from the inner surface with a thermal drill. Again, the thermal drill forms the protective interface by heating and displacing a portion of the exterior metal.

In some embodiments, forming the aperture can include machining an aperture into the exterior metal from to remove a portion of the exterior metal. The portion of exterior metal can include an aperture having a smaller diameter than the machining of the interior metal at block 904. In some embodiments, the exterior metal can be pushed or punched from the exterior direction into the relatively larger aperture machined in the interior metal forming a protective interface by displacing the portion of exterior metal transitionally into the machined portion of the interior metal. In some embodiments, the exterior metal can be drawn into the relatively larger aperture machined in the interior metal to form the protective interface.

In some embodiments, forming the aperture can include extruding the exterior metal through the removed portion of the interior metal. The extruded portion can have the benefit of a uniform thickness at the protective interface. In some embodiments, the extruded portion can also include a uniform grain structure at the protective interface. The uniform grain structure can include a hardness at the protective interface comparable to the hardness of the exterior metal of the raw clad material.

In some examples, forming the aperture can include an impact extrusion process. The impact extrusion can include a punch powered by a mechanical or hydraulic press. The punch is configured to force the metal (e.g. the exterior metal) to flow into a shape. In some examples, the metal is configured to flow in the opposite direction of the force delivered and around the punch. In some examples, the punch force can come from an interior side of the exterior metal, causing the metal to form the protective interface around the punch. In other examples, the punch may be configured to impact the exterior metal from an exterior side causing the exterior metal to be punched into an aperture machined out of the interior metal of block 904. In this examples, a portion of the exterior metal may be sheared from the impact of the punch into the aperture machined out of the interior metal. The protective interface can be formed by machining through the portion of the exterior metal with a smaller diameter than the punch and/or aperture machined out of the interior metal at block 904.

In some embodiments, forming the aperture can include machining a portion of the exterior metal from the inner surface and press fitting a slug into an opening formed by machining a portion of the exterior metal. Forming the aperture can further include machining the aperture through the slug. The aperture can be machined through the slug from the inner surface and/or the outer surface. In some examples, the slug can include the same metal as the exterior metal. In other examples, the slug can include a different metal or a non-metal (e.g. plastic, ceramic, etc.). In some examples, an interface disposed between the slug and the exterior metal can include a sealant to help protect the interior metal and secure the slug. In some examples, a bond between the slug and the exterior metal can include at least one of a friction weld or a laser weld. Other examples can include a flange on at least a portion of the slug configured to secure the slug within the exterior metal and/or the interior metal.

Figures 10A, 10B, 10C:
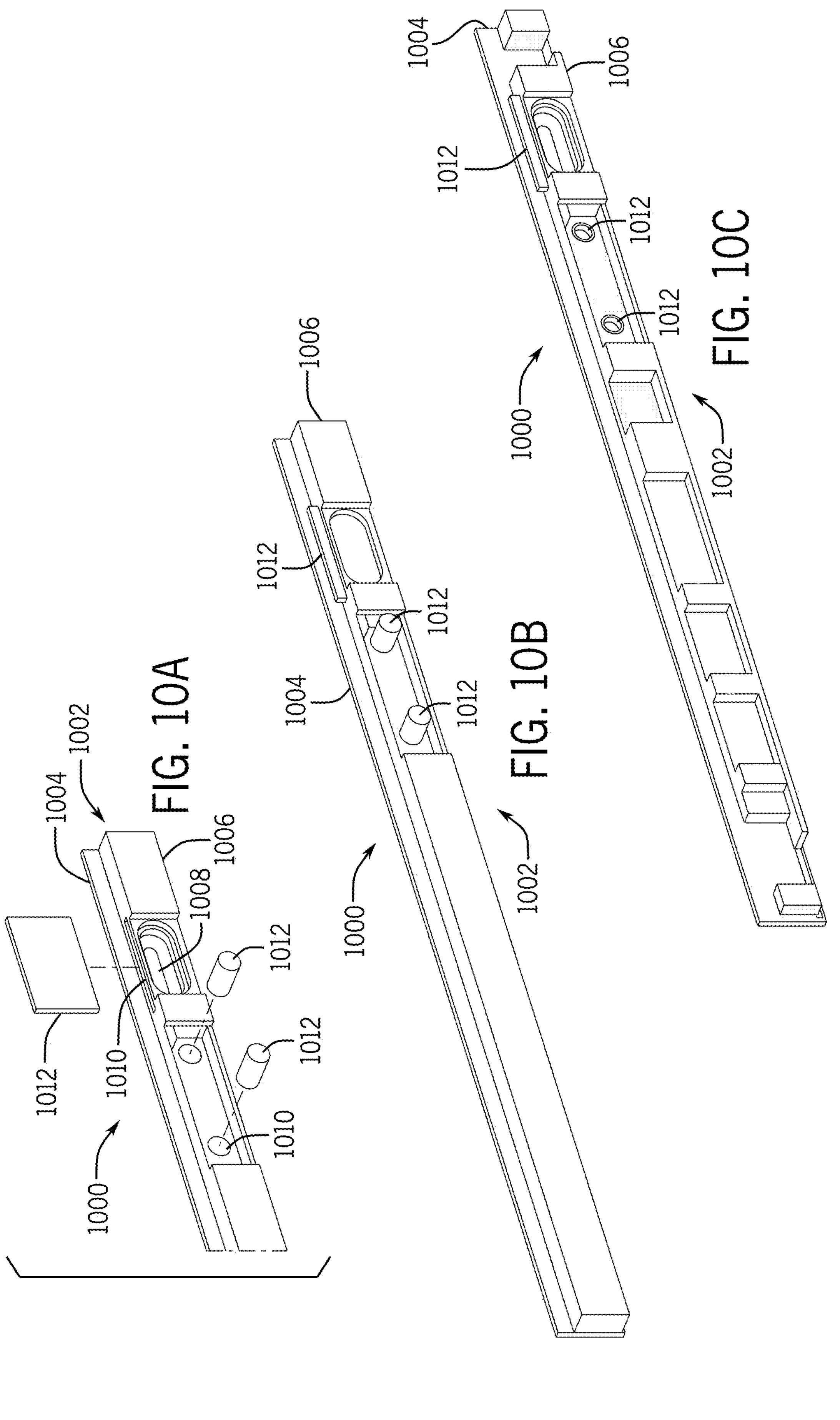
FIG. 10A illustrates a perspective view of a housing having portions of the housing removed and inserts being placed into the removed portions.
FIG. 10B illustrates the housing of FIG. 10A having inserts disposed between the exterior metal and the interior metal within the removed portion of the interior metal.
FIG. 10C illustrates the housing of FIG. 10A having an aperture machined through the clad structure and the insert.

A system configured to prevent galvanic corrosion of a housing can be included. FIG. 10A illustrates a perspective view of a housing 1000 having portions of the housing 1000 removed and inserts being placed into the removed portions, according to an embodiment. In some embodiments, the housing 1000 can include a clad structure 1002 having an exterior metal 1004 and an interior metal 1006. The housing shown in FIG. 10A has been machined to include various features and apertures configured to provide functionality to an electronic device. In some embodiments, an aperture 1008 can be formed into the clad structure 1002. The aperture can include a non-circular shape. In some examples, the aperture 1008 includes opening in the exterior metal 1004 of the clad structure 1002. The aperture 1008 can further include an opening through the interior metal 1006 of the clad structure 1002. The clad structure 1002 can further include an orifice or pocket 1010 machined into the clad structure 1002. The orifice 1010 can be configured to fit an insert 1012 within the orifice 1010. In some embodiments, the interior metal 1006 defines the orifice 1010 at the interface.

FIG. 10B illustrates the housing 1000 of FIG. 10A having inserts 1012 disposed between the exterior metal 1004 and the interior metal 1006 within the removed portion of the interior metal 1006. In other words, the interior metal 1006 defines an orifice at the interface of the clad structure 1002. In some embodiments, the insert 1012 can be disposed between the exterior metal 1004 and the interior metal 1006 within the orifice (e.g. pocket 1010) of the interior metal 1006. In some embodiments, the insert 1012 can include a corrosion resistant metal. In other embodiments, the insert 1012 can include a metal, a polymer, or a plastic. The insert can include any suitable material that does not cause galvanic corrosion of the clad structure 1002. In some embodiments, the insert 1012 can be retained in place with an adhesive configured to bond the insert within the removed portion of the clad structure 1002.

FIG. 10C illustrates the housing 1000 of FIG. 10A having an aperture formed through the clad structure 1002 and the insert 1012. The interior metal 1006 of the housing 1000 can be protected from an electrolyte and from galvanic corrosion because the insert ensures the interior metal 1006 is not exposed outside of the water-tight interior of the housing 1000. The insert 1012 can be disposed between the exterior metal 1004 and the interior metal 1006 and the insert 1012 can include more than one aperture machined through the insert 1012.

Figure 11:
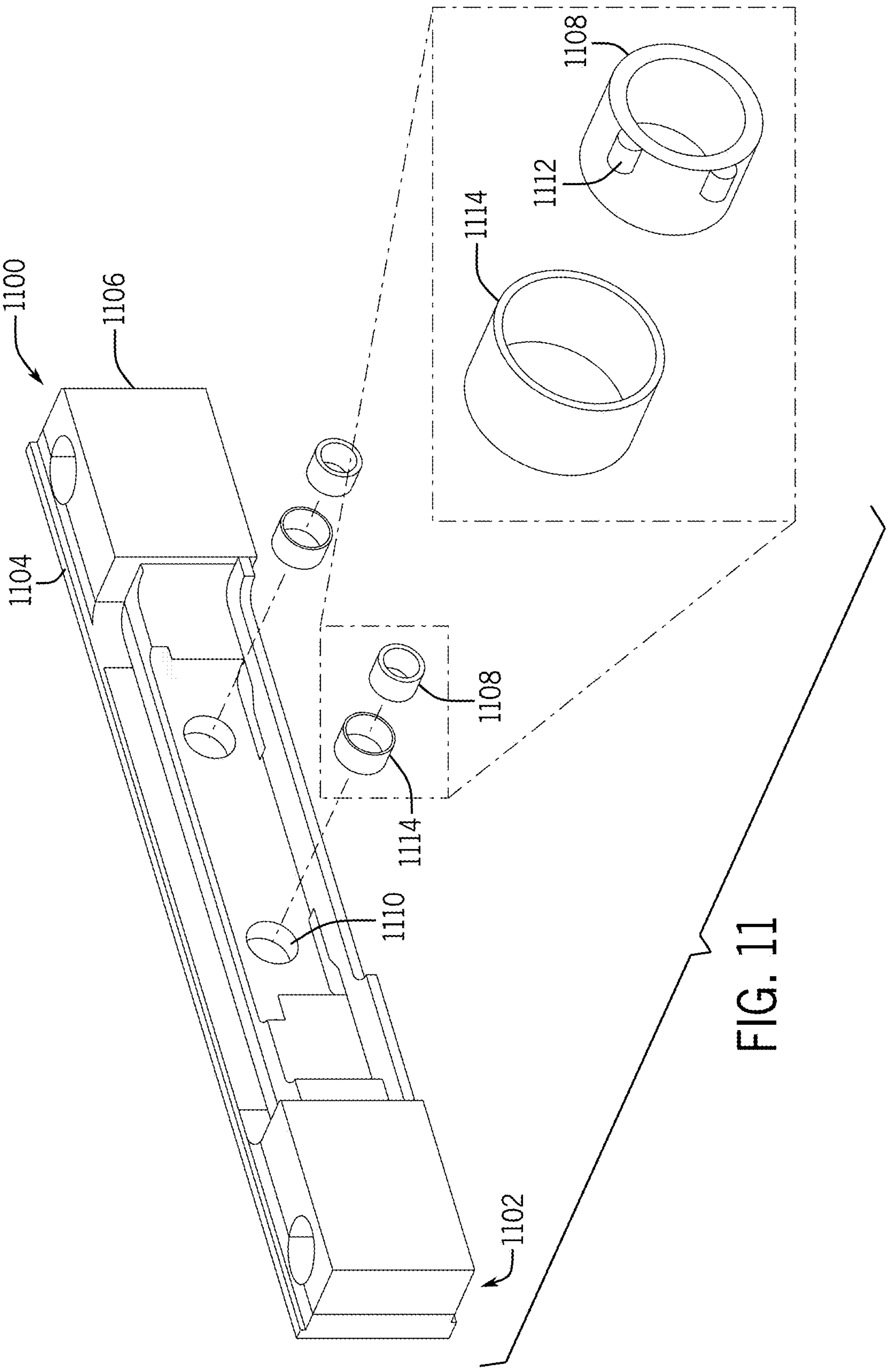
FIG. 11 illustrates a perspective view of a housing having portions of the housing removed and inserts being placed into the removed portions.

FIG. 11 illustrates a perspective view of a housing 1100 having portions of the housing 1100 removed and inserts being placed into the removed portions, according to an embodiment. In some embodiments, the housing 1100 can include a clad structure 1102 including an exterior metal 1104 and an interior metal 1106. An insert 1108 is shown being inserted into an aperture 1110 of the clad structure 1102. In some embodiments, the insert 1108 can include a lobe 1112 on an exterior surface of the insert 1108. The lobe 1112 can be included to ensure the insert 1108 is spaced properly when placed into the aperture 1110 so that the insert 1108 can be properly aligned and/or an adhesive can be applied evenly around the insert 1108. In some embodiments, the insert 1108 can include extensions or "tooth" structures around the circumference of the insert 1108 that secure the insert within the aperture 1110. In some embodiments, an adhesive 1114 can be included to secure the insert 1108 into the aperture 1110. The adhesive 1114 can be an electronics grade silicone adhesive or sealant, an epoxy, or a light-curing adhesive in some embodiments.

To the extent applicable to the present technology, gathering and use of data available from various sources can be used to improve the delivery to users of invitational content or any other content that may be of interest to them. The present disclosure contemplates that in some instances, this gathered data may include personal information data that uniquely identifies or can be used to contact or locate a specific person. Such personal information data can include demographic data, location-based data, telephone numbers, email addresses, TWITTER® ID's, home addresses, data or records relating to a user's health or level of fitness (e.g., vital signs measurements, medication information, exercise information), date of birth, or any other identifying or personal information.

The present disclosure recognizes that the use of such personal information data, in the present technology, can be used to the benefit of users. For example, the personal information data can be used to deliver targeted content that is of greater interest to the user. Accordingly, use of such personal information data enables users to calculated control of the delivered content. Further, other uses for personal information data that benefit the user are also contemplated by the present disclosure. For instance, health and fitness data may be used to provide insights into a user's general wellness, or may be used as positive feedback to individuals using technology to pursue wellness goals.

The present disclosure contemplates that the entities responsible for the collection, analysis, disclosure, transfer, storage, or other use of such personal information data will comply with well-established privacy policies and/or privacy practices. In particular, such entities should implement and consistently use privacy policies and practices that are generally recognized as meeting or exceeding industry or governmental requirements for maintaining personal information data private and secure. Such policies should be easily accessible by users, and should be updated as the collection and/or use of data changes. Personal information from users should be collected for legitimate and reasonable uses of the entity and not shared or sold outside of those legitimate uses. Further, such collection/sharing should occur after receiving the informed consent of the users. Additionally, such entities should consider taking any needed steps for safeguarding and securing access to such personal information data and ensuring that others with access to the personal information data adhere to their privacy policies and procedures. Further, such entities can subject themselves to evaluation by third parties to certify their adherence to widely accepted privacy policies and practices. In addition, policies and practices should be adapted for the particular types of personal information data being collected and/or accessed and adapted to applicable laws and standards, including jurisdiction-specific considerations. For instance, in the US, collection of or access to certain health data may be governed by federal and/or state laws, such as the Health Insurance Portability and Accountability Act (HIPAA); whereas health data in other countries may be subject to other regulations and policies and should be handled accordingly. Hence, different privacy practices should be maintained for different personal data types in each country.

Despite the foregoing, the present disclosure also contemplates embodiments in which users selectively block the use of, or access to, personal information data. That is, the present disclosure contemplates that hardware and/or software elements can be provided to prevent or block access to such personal information data. For example, in the case of advertisement delivery services, the present technology can be configured to allow users to select to "opt in" or "opt out" of participation in the collection of personal information data during registration for services or anytime thereafter. In another example, users can select not to provide mood-associated data for targeted content delivery services. In yet another example, users can select to limit the length of time mood-associated data is maintained or entirely prohibit the development of a baseline mood profile. In addition to providing "opt in" and "opt out" options, the present disclosure contemplates providing notifications relating to the access or use of personal information. For instance, a user may be notified upon downloading an app that their personal information data will be accessed and then reminded again just before personal information data is accessed by the app.

Moreover, it is the intent of the present disclosure that personal information data should be managed and handled in a way to minimize risks of unintentional or unauthorized access or use. Risk can be minimized by limiting the collection of data and deleting data once it is no longer needed. In addition, and when applicable, including in certain health related applications, data de-identification can be used to protect a user's privacy. De-identification may be facilitated, when appropriate, by removing specific identifiers (e.g., date of birth, etc.), controlling the amount or specificity of data stored (e.g., collecting location data a city level rather than at an address level), controlling how data is stored (e.g., aggregating data across users), and/or other methods.

Therefore, although the present disclosure broadly covers use of personal information data to implement one or more various disclosed embodiments, the present disclosure also contemplates that the various embodiments can also be implemented without the need for accessing such personal information data. That is, the various embodiments of the present technology are not rendered inoperable due to the lack of all or a portion of such personal information data. For example, content can be selected and delivered to users by inferring preferences based on non-personal information data or a bare minimum amount of personal information, such as the content being requested by the device associated with a user, other non-personal information available to the content delivery services, or publicly available information.

The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of the specific embodiments described herein are presented for purposes of illustration and description. They are not target to be exhaustive or to limit the embodiments to the precise forms disclosed. It will be apparent to one of ordinary skill in the art that many modifications and variations are possible in view of the above teachings.

What is claimed is:

1. A housing sidewall of a portable electronic device, comprising:
- an elongate clad material comprising:
  - titanium defining an external surface of the portable electronic device;
  - aluminum secured to the titanium and defining an internal surface of the portable electronic device;
  - a melt interface defined by the titanium and the aluminum;
  - a recessed feature defined by the melt interface, the melt interface having an axis perpendicular to the external surface and extending a length of the recessed feature; and
  - a non-metallic portion coupled to the melt interface at the recessed feature.

2. The housing sidewall of claim 1, wherein the recessed feature comprises an aperture extending through the housing sidewall.

3. The housing sidewall of claim 1, wherein the recessed feature includes at least one of grooves or teeth.

4. The housing sidewall of claim 1, wherein the non-metallic portion comprises a polymer.

5. The housing sidewall of claim 1, wherein the external surface is curved.

6. The housing sidewall of claim 1, wherein the titanium covers the aluminum to prevent exposure of the aluminum to an external environment of the portable electronic device.

7. The housing sidewall of claim 1, wherein the non-metallic portion is coupled directly to the melt interface.

8. The housing sidewall of claim 1, wherein the non-metallic portion is coupled to the melt interface via an adhesive.

9. A housing for an electronic device, comprising:
a sidewall comprising:
titanium defining an external surface;
aluminum secured directly to the titanium forming a clad interface between the titanium and aluminum; and
an engagement feature defined by a melt interface, the melt interface having an axis perpendicular to the clad interface and the extending a length of the engagement feature; and
a polymeric portion coupled to the melt interface at the engagement feature.

10. The housing of claim 9, wherein the engagement feature comprises at least one of a recess or a hole in the sidewall.

11. The housing of claim 9, wherein the polymeric portion is mechanically interlocked with the engagement feature.

12. The housing of claim 9, wherein the polymeric portion comprises plastic.

13. The housing of claim 9, wherein the sidewall comprises an elongate structure.

14. The housing of claim 13, wherein:
the engagement feature is a first engagement feature; and
the housing comprises a second engagement feature.

15. The housing of claim 14, wherein:
the polymeric portion is a first polymeric portion; and
the housing comprises a second polymeric portion coupled to the aluminum at the second engagement feature.

16. A housing component for an electronic device, comprising:
a part comprising:
a clad material, comprising:
a titanium portion defining a curved external surface;
an aluminum portion secured to the titanium portion and defining an internal surface opposite the external surface; and
a clad interface defined between the titanium portion and the aluminum portion;
a melt interface defined by the titanium portion and the aluminum portion;
an engagement feature defined by the melt interface, the melt interface extending into the clad material from the internal surface, the melt interface defined by the titanium portion and the aluminum portion and extending a length of the engagement feature; and
a non-metallic material coupled to the part and extending into the engagement feature and coupled to the melt interface at the engagement feature.

17. The housing component of claim 16, wherein the engagement feature extends into the titanium portion.

18. The housing component of claim 17, wherein the non-metallic material contacts the aluminum portion and the titanium portion.

19. The housing component of claim 16, wherein the non-metallic material comprises a polymer.

20. The housing component of claim 16, wherein the non-metallic material comprises plastic.

* * * * *